United States Patent [19]

Haining et al.

[11] 3,988,408

[45] Oct. 26, 1976

[54] STABILIZATION OF PRINTED CIRCUIT BOARD CORE LAMINATES

[75] Inventors: Frank W. Haining, Binghamton; Robert V. Rubino, Endicott; Robert T. Wiley, Binghamton, all of N.Y.

[73] Assignee: International Business Machines Corporation, Armonk, N.Y.

[22] Filed: Sept. 16, 1974

[21] Appl. No.: 506,644

[52] U.S. Cl. ................................. 264/156; 29/625; 156/3; 156/253; 264/235; 264/104; 264/343; 264/346
[51] Int. Cl.² ..................... H05K 3/00; B32B 31/16
[58] Field of Search .................. 264/343, 345–346, 264/234–235, 104, 340, 156, 155; 174/68.5; 29/625; 156/85, 381, 253, 3

[56] References Cited
UNITED STATES PATENTS

| | | |
|---|---|---|
| 3,210,214 | 10/1965 | Smith .................................. 427/99 |
| 3,352,960 | 11/1967 | McLaughlin ....................... 264/340 |
| 3,409,988 | 11/1968 | Zelnick .............................. 264/235 |
| 3,452,133 | 6/1969 | Bratton et al. ..................... 264/346 |
| 3,466,360 | 9/1969 | Chipman ............................. 156/85 |
| 3,508,330 | 4/1970 | Kubik ................................. 29/628 |
| 3,799,802 | 3/1974 | Schneble, Jr. et al. ............. 29/625 |

Primary Examiner—Jeffery R. Thurlow
Attorney, Agent, or Firm—Cyril A. Krenzer

[57] ABSTRACT

A process for stabilizing printed circuit board substrate or laminate through application of a number of laminate conditioning and baking cycles which function to provide the laminates with dimensional stability. This enables greater control and more precise drilling of the laminates in subsequent fabrication and assembly operations. The dimensional stability for a substrate becomes more critical as the substrate size is increased.

2 Claims, 2 Drawing Figures

STABILIZATION OF PRINTED CIRCUIT BOARD CORE LAMINATES

BACKGROUND OF THE INVENTION

1. Field of the Invention

This invention relates to a method of stabilizing printed circuit board substrate laminates through application of a number of laminate conditioning and baking cycles.

2. Description of the Prior Art

In the present day technology to which this invention relates, the fabrication of printed circuit boards utilizes critical processes. The signal cores of such printed circuit boards are frequently made from a laminate comprising epoxy-glass or like material in the order of from 3 to 20 mils thick exclusive of a copper layer on both sides of the core laminate. Generally, the core is fabricated by etching the copper from both sides of the laminate except for a small border. A plurality of interconnection through-holes, commonly called "vias," are drilled in the core laminate. This is followed by pattern plating the proper circuits on each side of the core laminate. If the "vias" do not align properly with the electrical interconnecting pads at the end of the signal lines forming the circuit patterns, the electrical interconnections between the signal circuits cannot be established.

U.S. Pat. No. 3,210,214 relates to a method of forming precise electrical conductive patterns on insulative substrates. The process includes an annealing of the substrate to eliminate the formation of strains within the substrate. U.S. Pat. Nos. 3,708,876 and 3,755,890 both relate to the vacuum-heat treatment of printed circuit boards to drive off vaporizable matter. U.S. Pat. No. 3,508,330 relates to the method of making integral conductor paths and through-holes in multilayer boards.

Empirically, it was learned that even though the holes have been drilled in the laminate cores at their proper locations, by the time that the signal line patterns were defined and created on the core laminates, the "vias" did not register with the electrical interconnecting pads. An investigation into the causes for this dimensional shift revealed an irreversible dimensional change in the core as a result of the etching of the copper from the core laminate. There is also a reversible expansion and contraction of the core due to humidity. The criticality of the dimensional changes is proportional to the size of the core laminate.

SUMMARY OF THE INVENTION

The core stabilization process of the present invention overcomes disadvantages of prior known processes and includes features and advantages of enabling the production of thin laminates that may be used as signal cores and which are dimensionally stable and more suitable for drilling operations and the subsequent assembly of more precise printed circuit substrates.

Briefly, laminates with a layer of copper on both sides are submitted to an etching process for removing all of the copper on both sides of the laminate except for a small border. The core laminate is allowed to air dry wherein the core will expand in length direction and shrink in the width direction. If the core is then allowed to reside in a room temperature of approximately 72° F and a relative humidity of about 50%, it will expand in both the length and width directions. The core laminate is then baked to remove the moisture wherein it will contract in both directions. If the core laminate is then stored in room conditions of temperature of about 72° F and relative humidity of approximately 50%, the core laminate will once more expand but will not restore to the same dimensions as prior to the first bake operation. If the core laminate is then alternately baked and stored in controlled room conditions, it will restore back to substantially the same dimensions after each bake and exposure operation.

It is a primary object of the present invention to remove the irreversible dimensional change and to control the reversible component of dimensional change in the processing of printed circuit board core laminates.

It is another important object of the invention to provide an improved method of manufacturing printed circuit boards.

It is another object of the invention to subject printed circuit board laminates to an improved treatment process which assures highly reliable electrical connections by way of the through-holes to opposite sides of the core laminates.

It is a further important object of the invention to reduce substantially if not eliminate completely the dimensional changes in printed circuit board core laminates due to exposure to different environmental conditions during processing operations.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

Figure 1:
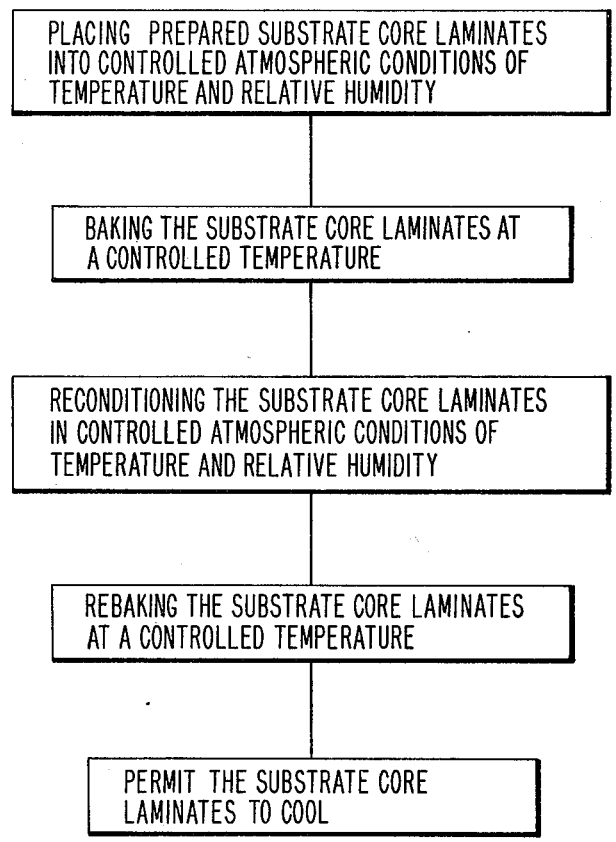
FIG. 1 illustrates the stabilization of substrate core laminates by the process of this invention.
Figure 2:
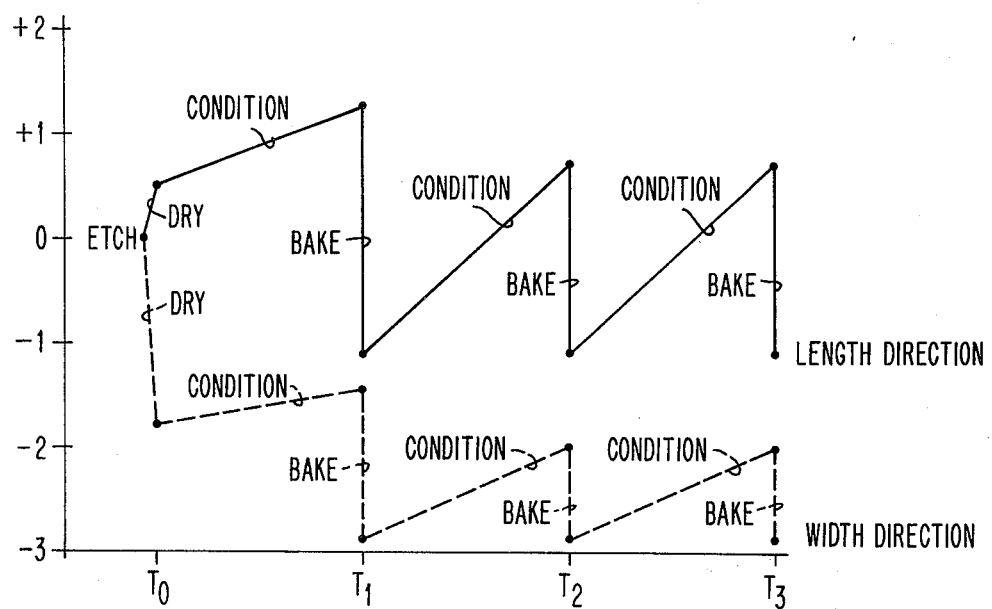
FIG. 2 depicts the magnitude and direction of the dimensional changes observed in a typical signal core substrate laminate in accordance with the process of this invention.

Referring to FIG. 1, there is shown the process steps for stabilizing of thin core laminates used in printed circuit board or card structures. In the printed circuit board structuring art, the cores are usually made of a laminate comprising one or more layers of prepreg material. The prepreg materials, which are glass cloth impregnated with resin, generally have a resin content in the range of 40 to 80% and may be of the G-10 type epoxy laminating resin. This resin may be modified to include particulate flame retarders and/or halogenated epoxy resins such as the FR series. Other cores using polyimide laminating resins have also been stabilized by the process of the instant invention wherein resins such as Gemon L (product of General Electric Company), Pyralin 2 (product of E. I. du Pont de Nemours Company, Inc.), AL-300 (product of Atlantic Laminates), or Micaply 5036 (product of Mica Corporation) have been used. The laminates commonly include a woven glass cloth material for reinforcement purposes.

Signal core planes for printed circuit boards are commonly made from a laminate comprising approximately 6 mil thick epoxy-glass and including a metallized layer on both sides. The size or area of the printed circuit board is dependent upon the quantity and type of circuits to be fabricated thereon. Generally, the core is fabricated by etching the metal, usually copper, from both sides of the laminate layer except for a small border, as for example approximately one inch. A plurality of interconnection through-holes, often referred to as "vias," are then drilled in the core laminate. This is followed by pattern plating of the proper circuits on each side of the core laminate. It was experienced that even though the "vias" had been drilled in the cores at the proper locations that after the signal lines were fabricated on the core the "vias" did not register with the electrical interconnecting pads at the end of the signal lines on the cores. Investigations into the causes for this dimensional shift revealed that there is an irreversible dimensional change in the cores as a result of the etching of the copper from the cores prior to the "via" drilling operation and that there is a reversible expansion and contraction of the core due to humidity content in the environmental atmosphere.

The elimination of the irreversible dimensional change and the control of the reversible components of the dimensional change are effected through the core stabilizing process of the present invention which comprises the steps of placing prepared substrate core laminates into controlled atmospheric conditions of temperature and relative humidity; baking the substrate core laminates at a controlled temperature; reconditioning the substrate core laminates in controlled atmospheric conditions of temperature and relative humidity; rebaking the substrate core laminates at a controlled temperature; and, permitting the substrate core laminates to cool.

More detailedly, after the copper or metal is etched from both sides of the core laminate, the laminate is allowed to air dry at room temperature which may vary from 60° F to 100° F with a relative humidity that may vary from 0% to 80% wherein the core may expand or contract in both the length and width directions. The core is then baked to remove moisture wherein it will contract in both directions. The temperatures range from 150° F to 250° F. Above the 250° F the glass transition temperature of the cured laminating resin is approached. Below the 150° F temperature the oven is ineffective at reducing the relative humidity of the room air. After the first bake and prior to the second bake operations, the cores must be stored at a combination of relative humidity and temperature for a period of time which will permit them to expand. The relative humidity condition can range from one hour at 100% relative humidity to a period of 24 hours at approximately 20% relative humidity. The temperature at which this reconditioning occurs is 80° ± 20° F. The cores will once more expand but will not reach the same dimensions as prior to the first bake operation. Rebaking the substrate core laminates at the controlled conditions of the first bake operation will remove the humidity from the core laminates and provide them with dimensional stability. If the cores are alternately baked and stored in the room at controlled atmospheric conditions, they revert back to the same dimensions after each cycle.

The larger the size of the core laminates, the more critical is the stabilization process to the success of subsequent printed circuit board processing operations. Cores of up to 36 inches square have been satisfactorily stabilized by the above disclosed process. Conceivably any size core that is practical to lamination operations can be stabilized by the disclosed process of the instant invention.

While the invention has been particularly shown and described with reference to preferred embodiments thereof, it will be understood by those skilled in the art that the foregoing and other changes in form and details may be made therein without departing from the spirit and scope of the invention.

What is claimed is:
1. A method for providing dimensional stability to a substrate core laminate for a printed circuit board, said laminate comprising a substrate core including a woven glass cloth impregnated with a resin, wherein said core is metallized on both sides with a conductive metal, which conductive metal is etched away from all but a border on both sides of said substrate core laminate, said method comprising the steps of:
  drying said substrate core laminate at a temperature of 80° ± 20° F and a relative humidity of 40% ± 40%:
  baking the substrate core laminate at a controlled temperature of 200° ± 50° F;
  reconditioning the substrate core laminate for a period of between 1 hour and 24 hours at a relative humidity between 100% and 20% and at a controlled temperature of 80° ± 20° F;
  rebaking the substrate core laminate at a controlled temperature of 200° ± 50° F;
  cooling the substrate core laminate; and
  drilling through holes in the said substrate core laminate.
2. A method of providing a substrate core laminate for a printed circuit board with dimensional stability as defined in claim 1 wherein the period of time to effect the baking cycles is from 10 to 30 minutes.

* * * * *